United States Patent
Miya et al.

(10) Patent No.: US 7,119,536 B2
(45) Date of Patent: Oct. 10, 2006

(54) TWO-RESOLVER DEVIATION ANGLE DETECTOR HAVING SERIALLY CONNECTED OUTPUT WINDINGS

(75) Inventors: Taiichi Miya, Tokyo (JP); Mutsumi Matsuura, Tokyo (JP)

(73) Assignee: Minebea Co., Ltd., Nagano-ken (JP)

( * ) Notice: Subject to any disclaimer, the term of this patent is extended or adjusted under 35 U.S.C. 154(b) by 281 days.

(21) Appl. No.: 10/766,322

(22) Filed: Jan. 29, 2004

(65) Prior Publication Data

US 2004/0257025 A1 Dec. 23, 2004

(30) Foreign Application Priority Data

Feb. 4, 2003 (JP) ............................. 2003-027434

(51) Int. Cl.
*G01B 7/30* (2006.01)
(52) U.S. Cl. .................... 324/207.25; 324/207.18; 318/661; 318/653; 310/168
(58) Field of Classification Search ........... 324/207.12, 324/207.15, 207.16, 207.17, 207.25, 207.18; 318/653, 661; 310/168, 68 B
See application file for complete search history.

(56) References Cited

U.S. PATENT DOCUMENTS

| | | | | |
|---|---|---|---|---|
| 3,584,276 A | * | 6/1971 | Ringland et al. | ........... 318/721 |
| 3,641,467 A | * | 2/1972 | Ringland et al. | ............... 336/5 |
| 3,705,343 A | * | 12/1972 | Ringland et al. | ........... 323/348 |
| 3,885,209 A | | 5/1975 | Lazarus | |
| 4,762,007 A | | 8/1988 | Gasperi et al. | |
| 5,708,344 A | * | 1/1998 | Hayashi et al. | ............. 318/605 |

FOREIGN PATENT DOCUMENTS

| | | |
|---|---|---|
| EP | 0527305 A1 | 6/1992 |
| EP | 0877464 A2 | 11/1998 |
| JP | A-11-321689 | 11/1999 |
| JP | 2001-194251 | 7/2001 |
| JP | A-2001-272204 | 10/2001 |

* cited by examiner

*Primary Examiner*—Jay M. Patidar
(74) *Attorney, Agent, or Firm*—Adduci, Mastriana & Schaumberg, L.L.P.

(57) ABSTRACT

A deviation angle detector enlarges the application range by enlarging the detectable deviation angle range. The deviation angle detector has two resolvers, which have rotors, stators, and single excitation windings and multiple output windings that are coiled around the stators. The difference in rotation angles of the resolvers is detected as a deviation angle $\Delta\theta$ by calculating the output signal that corresponds to the rotation angles of the resolvers digitally or in analog. The corresponding output windings of the resolvers are connected in series and the output signals are extracted from the serially connected output windings and calculated digitally or in analog.

9 Claims, 3 Drawing Sheets

TWO-RESOLVER DEVIATION ANGLE DETECTOR HAVING SERIALLY CONNECTED OUTPUT WINDINGS

CROSS REFERENCE TO RELATED APPLICATION

The present application is related to, and claims priority from, Japanese patent application no. 2003-027434, filed on Feb. 4, 2003, the contents of which are incorporated herein by reference.

BACKGROUND OF THE INVENTION

The present invention relates to deviation angle detectors, and particularly one in which the difference in the rotation angles of two resolvers is detected as a deviation angle.

Conventional deviation angle detectors include a rotor, a stator, and a single excitation winding and multiple output windings, which are coiled around the stator. The difference in the rotation angles of the resolvers is detected as a deviation angle by calculating the output signal that corresponds to the rotation angles of the resolvers digitally or in analog. For example, a typical deviation angle detector is used as a means to find a transmission torque by detecting the distortion angle of a power transmission angle. An example of such a deviation angle detector is discussed in Japanese Unexamined Patent Application Publications H11-321689 and 2001-272204.

FIGS. 4 and 5 show conventional examples of a deviation angle detector.

The deviation angle detector 100 shown in FIG. 4 includes two resolvers (variable reluctance resolvers) VR1 and VR2. Resolver VR1 includes rotor 110, stator 111, and single excitation windings (not shown) and multiple output windings 112 and 113 that are coiled around stator 111. Resolver VR2 includes rotor 120, stator 121, and single excitation windings (not shown) and multiple output windings 122 and 123 that are coiled around stator 121. The output signals Es1 and Es2 (sine signals) and Ec1 and Ec2 (cosine signals) from the output windings 112, 113 and 122, 123 from each of the resolvers VR1 and VR2 are input to each of the R/D converters (resolver digital converters) 114 and 124 and digitized. Then, the digitized signals are input to the controller 140 and calculated. Thus, the deviation angle $\Delta\theta$ is calculated as the difference of the rotation angles $\theta_1$ and $\theta_2$ of the rotors 110 and 120 of each of the resolvers VR1 and VR2.

However, deviation angle detector 100 employs a method in which each of the output signals $E_{s1}$, $E_{s2}$ and $E_{c1}$, $E_{c2}$ are separately calculated (can be an analog calculation) by using two resolvers VR1 and VR2, and therefore it requires two R/D converters 114 and 124, and consequently, there have been problems in terms of cost, space, processing speed, etc.

Therefore, as with deviation angle detector 200 shown in FIG. 5, a method has been proposed in which each of the output windings 212, 222 and 213, 223 that correspond to each of the resolvers VR1 and VR2 is connected in parallel. The output signals Es1 and Es2 (sine signals) and Ec1 and Ec2 (cosine signals) that correspond to the difference in rotation angles (deviation angle) $\Delta\theta$ is extracted from the connected portion. Then, the output signals are input to the R/D converter 230. Next, the digitized signal from the R/D converter 230 is input to the controller 240. Thus, the deviation angle $\Delta\theta$ is calculated. According to this method, only one R/D converter 230 is required, and thus, the above-mentioned problem is solved.

However, with the deviation angle detector 200 shown in FIG. 5, the maximum deviation angle $\Delta\theta$ that can be detected with high precision is $\pm 22.5°$ (see Japanese Unexamined Patent Application Publication 2001-272204). Therefore, a problem with conventional deviation angle detectors is that the application range of the detector 200 is limited.

SUMMARY OF THE INVENTION

In view of the above, a deviation angle detector is provided that solves problems such as cost, space and processing speed, and at the same time, enlarges the detectable deviation angle range in order to enlarge the application range.

The deviation angle detector may be formed having two resolvers each including a rotor, a stator, and a single excitation winding and multiple output windings, which are coiled around the corresponding stator. The difference in the rotation angles of the resolvers is detected as a deviation angle. The detection is performed by calculating the output signal that corresponds to the rotation angles of the resolvers. The output signals are characterized by the serially connected output windings that correspond to the resolvers. The output signals are extracted from the serially connected output windings and digital or analog processing thereof can be carried out.

Further, the output windings of each of the resolvers include two types of windings that are coiled by shifting the phase by 90°.

Additionally, the output signals from the serially connected output windings may be input to a single analog or digital calculation converter.

Therefore, in accordance with the present invention, an output signal that corresponds to the difference in rotation angles, deviation angle $\Delta\theta$, of the resolvers is extracted from the serially connected output windings of the resolvers. The output signal requires only one analog or digital calculation converter, and consequently, a decrease in cost, economy of space and an improvement in processing speed can be achieved.

Further, when the output windings of each resolver includes two types of output windings that are coiled, shifting the phase by 90°, Es (sine signal) and Ec (cosine signal), which are output from serially connected output windings, can be represented by sine ($\Delta\theta$) and cosine ($\Delta\theta$), which are functions of the deviation angle $\Delta\theta$ of the resolvers. The deviation angle $\Delta\theta$ can be found with $\Delta\theta = \tan^{-1}$ (Es/Ec). Therefore, the detectable range of the deviation angle $\Delta\theta$ is enlarged up to $\pm 90°$ and the application range of the deviation angle detector is enlarged.

BRIEF DESCRIPTION OF THE DRAWINGS

The accompanying figures, in which like reference numerals refer to identical or functionally similar elements and which together with the detailed description below are incorporated in and form part of the specification, serve to further illustrate preferred embodiments and to explain various principles and advantages all in accordance with the present invention.

DETAILED DESCRIPTION OF THE PREFERRED EMBODIMENTS

Figure 1:
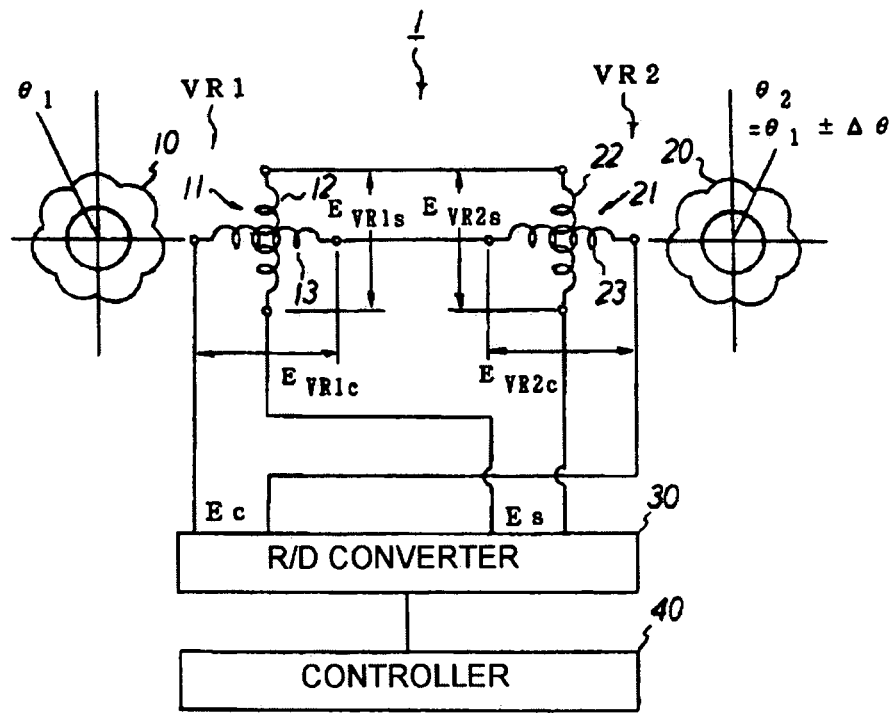
FIG. 1 shows a circuit diagram of the deviation angle detector of the present invention.

FIG. 1 shows a circuit diagram of a deviation angle detector 1 of the present invention. The deviation angle detector 1 is has two resolvers (variable reluctance resolvers) VR1 and VR2, R/D converter 30, and a controller 40.

The resolver VR1 includes a rotor 10, stator 11, and a single excitation winding (not shown) and multiple output windings 12 and 13 that are coiled around the stator 11. Here, the output winding includes two types of coiled windings 12 and 13, thereby shifting the phase by 90°. The windings output the sine element and the cosine element of the rotation angle $\theta_1$ of the rotor 10, respectively.

Similarly, the resolver VR2 includes a rotor 20, stator 21, and a single excitation winding (not shown) and multiple output windings 22 and 23 that are coiled around the stator 21. Here, the output winding includes two types of coiled windings 22 and 23, thereby shifting the phase by 90°. The windings output the sine element and the cosine element of the rotation angle $\theta_1$ of the rotor 20, respectively.

As described above, the deviation angle detector 1 of the present embodiment is such that the output windings 12 and 22 corresponding to resolvers VR1 and VR2, respectively, output the sine element of the output signals. The output windings 12 and 22 are serially connected and output windings 13 and 23 that output the cosine element of the output signals are serially connected. Then, the output signals Ec and Es are extracted from the serially connected output windings 12 and 22 and the output windings 13 and 23, and then they are input to the R/D converter 30 and digitized. Based on the digitized output signals Es and Ec, the deviation angle $\Delta\theta$ ($\Delta\theta=\theta_1-\theta_2$) of the resolvers VR1 and VR2 is calculated by calculating it in the controller 40.

The detection method of the deviation angle $\Delta\theta$ is described in detail as follows.

When an alternating voltage: $KE \sin \omega t$ (K is a constant, E is a transformation ratio, $\omega$ is the angular frequency, and t is time) is applied as an input signal to the excitation windings (not shown) that are coiled around each of stators 11 and 21 of each of the resolvers VR1 and VR2, the following signals are output to the output windings 12, 13 and 22, 23 of each of the resolvers VR1 and VR2.

Sine signal output $E_{VR1s}$ and cosine signal output $E_{VR1c}$ that are output from the output windings 12 and 13 of the resolver VR1 are:

$$E_{VR1s} = KE \sin \omega t \times \sin \theta_1$$

$$E_{VR1c} = KE \sin \omega t \times \cos \theta_1$$

Sine signal output $E_{VR2s}$ and cosine signal output $E_{VR2c}$ that are output from the output windings 22 and 23 of the resolver VR2 are:

$$E_{VR2s} = KE\sin\omega t \times \sin\theta_2$$
$$= KE\sin\omega t \times \sin (\theta_1 \forall \Delta\theta)$$

$$E_{VR2c} = KE\sin\omega t \times \cos\theta_2$$
$$= KE\sin\omega t \times \cos (\theta_1 \forall \Delta\theta)$$

Here, $\Delta\theta$ is the deviation angle of resolvers VR1 and VR2.

When the output windings that output the sine element of the output signal are serially connected and the output windings that output the cosine element of the output signals are serially connected, sine output signal Es is:

$$Es = E_{VR1s} - E_{VR2s}$$
$$= KE\sin\omega t \times \sin\theta_1 - KE\sin\omega t \times \sin\theta_2$$
$$= KE\sin\omega t \times \sin\theta_1 - KE\sin\omega t \times \sin (\theta_1 \forall \Delta\theta)$$
$$= KE\sin\omega t \times \{\sin\theta_1 - \sin (\theta_1 \forall \Delta\theta)\}$$

Here, when the electric zero point of the resolvers VR1 and VR2 is set to zero, $\theta_1=0$. Therefore, it is:

$$Es = KE\sin\omega t \times \sin(\forall \Delta\theta) \qquad (1)$$
$$= \forall KE\sin\omega t \times \sin(\Delta\theta) \ldots$$

Thus, the sine output signal Es can be represented as a sine function of the deviation angle $\Delta\theta$ of the resolvers VR1 and VR2.

Similarly, the cosine output element is:

$$Ec = E_{VR1c} - E_{VR2c}$$
$$= KE\sin\omega t \times \sin\theta_1 - KE\sin\omega t \times \cos\theta_2$$
$$= KE\sin\omega t \times \cos\theta_1 - KE\sin\omega t \times \cos (\theta_1 \forall \Delta\theta)$$
$$= KE\sin\omega t \times \{\cos\theta_1 - \cos (\theta_1 \forall \Delta\theta)\}$$

Here, when the electric zero point of the resolvers VR1 and VR2 is set to zero, $\theta_1=0$. Therefore, it is:

$$Ec = KE\sin\omega t \times \cos(\forall \Delta\theta) \qquad (2)$$
$$= \forall KE\sin\omega t \times \cos(\Delta\theta) \ldots$$

Thus, the cosine output signal Ec can be represented as the cosine function of the deviation angle $\Delta\theta$ of the resolvers VR1 and VR2.

The calculation of the deviation angle $\Delta\theta$ is carried out as follows.

Sine output element Es and cosine output element Ec that are represented in the aforementioned formulas (1) and (2) are input to single R/D converter 30 as described above, and digitized, and then input to the controller 40.

Meanwhile, from the above-mentioned formulas (1) and (2), formulas (3) and (4) can be obtained as follows.

$$\tan(\Delta\theta) = Es/Ec \qquad (3)$$

$$\Delta\theta = \tan^{-1}(Es/Ec) \qquad (4)$$

Therefore, in accordance with formula (4), the deviation angle $\Delta\theta$ can be calculated.

Figure 2:
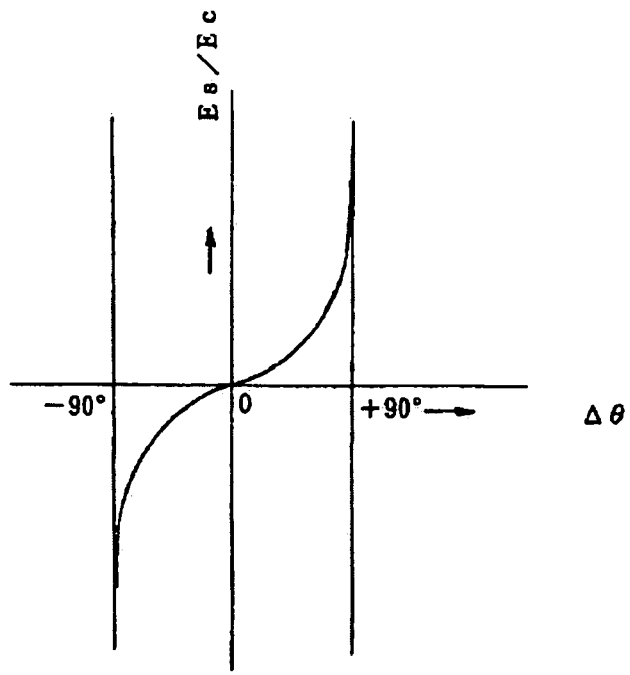
FIG. 2 shows a graphical illustration of the correlation between a deviation angle $\Delta\theta$ and an output ratio (Es/Ec) detected by the deviation angle detector of FIG. 1.

FIG. 2 shows a graphical illustration of formula (3) wherein the x-axis is the deviation angle Δθ and the y-axis is the output ratio (Es/Ec).

As is clear from FIG. 2, the range of the deviation angle Δθ that can be detected by the deviation angle detector of the present invention is ±90° and it is significantly enlarged compared to the conventional range, which was ±22.5°.

As described above, with the deviation angle detector 1 of the present invention, output signals Es and Ec, which correspond to the difference in rotation angle (deviation angle) Δθ of the resolvers VR1 and VR2, are extracted from serially connected output windings 12, 22 and 13 and 23 of the resolvers VR1 and VR2. Therefore, the deviation angle detector 1 requires only one R/D converter, and consequently, a decrease in cost, economy of space, a processing speed improvement, etc., can be achieved.

In addition, the detectable range of the deviation angle Δθ is enlarged up to ±90°, and therefore, the application range of the deviation angle detector 1 is enlarged.

Figure 3:
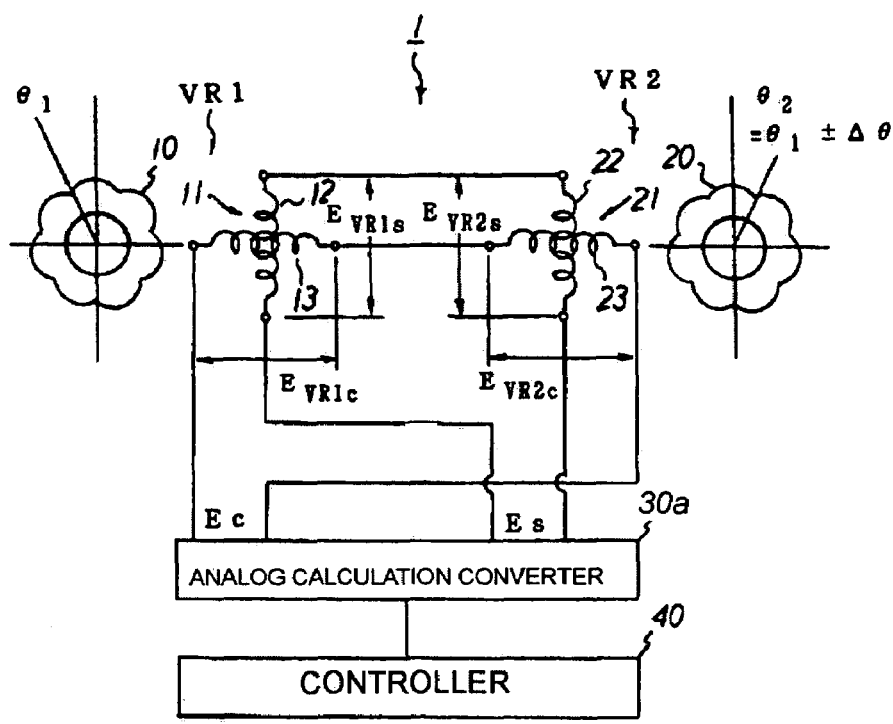
FIG. 3 shows a circuit diagram of the deviation angle detector of another embodiment of the present invention.
Figure 4:
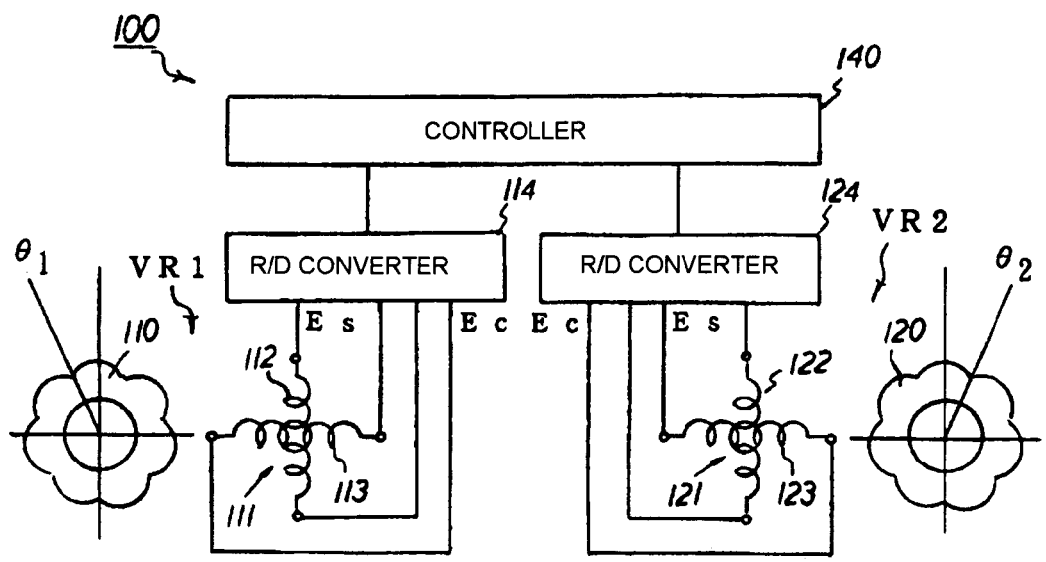
FIG. 4 is a conventional circuit diagram of a deviation angle detector having two resolver digital converters.
Figure 5:
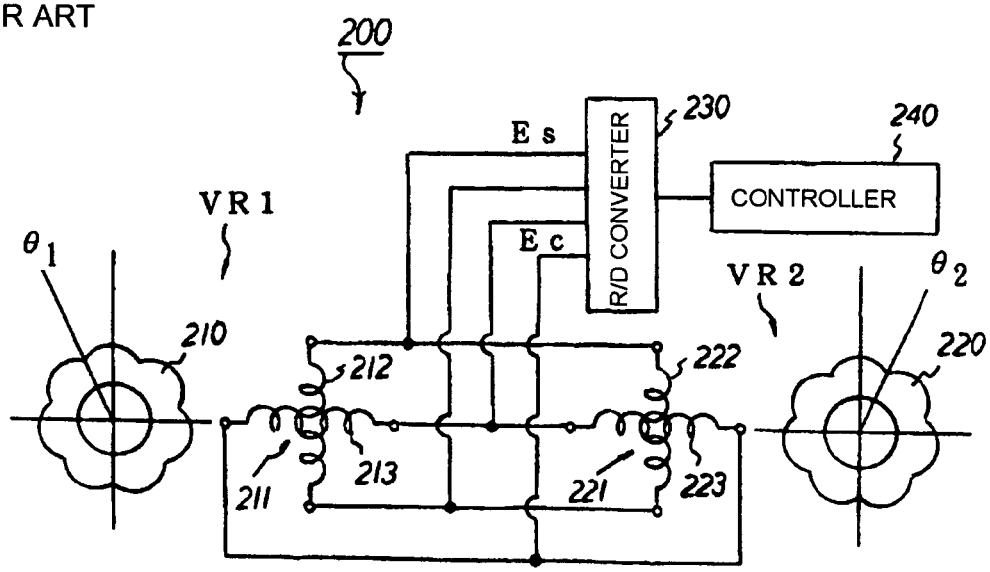
FIG. 5 is a conventional circuit diagram of a deviation angle detector having one resolver digital converter.

In the illustrated embodiment, the output signals were extracted from the output windings and digitized; however, analog processing can be carried out, and in that case, a single analog calculation converter 30a can be used, as shown in FIG. 3.

As is clear from the above description, the present invention is a deviation angle detector having two resolvers that include a rotor, a stator, and single excitation windings and multiple output windings that are coiled around the stator. The difference in rotation angles of the resolvers is detected as a deviation angle by calculating the output signal that corresponds to the rotation angles of the resolvers digitally or in analog.

The corresponding output windings of the resolvers are connected in series and the output signal is extracted from the serially connected output windings and calculated digitally or in analog. Therefore, the deviation angle detector described herein can solve the problems of, for example, cost, space and processing speed. Additionally, the detectable deviation angle range is enlarged and consequently, an effect can be achieved such that the application range of the deviation angle detector can be enlarged.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The illustrated embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A deviation angle detector, comprising:
    a plurality of resolvers, wherein each of the resolvers includes a rotor, a stator, a single excitation winding, and multiple output windings, and each of the windings is coiled around a corresponding stator, wherein:
        a difference in rotation angles between the resolvers is detected as a deviation angle by determining output signals that correspond to the rotation angles of each of the resolvers;
        the output windings that correspond to each of the resolvers are serially connected, and the output signals are extracted from the serially connected output windings; and
        one of digital and analog processing is performed on the output signals of the resolvers.

2. A deviation angle detector in accordance with claim 1, wherein the output windings of each of the resolvers further comprise two types of windings, the phases of which are shifted by 90°.

3. A deviation angle detector in accordance with claim 1, wherein the output signals from the serially connected output windings are input to one of a single analog calculation converter and a single digital calculation converter.

4. A deviation angle detector in accordance with claim 2, wherein the output signals from the serially connected output windings are input to one of a single analog calculation converter and a single digital calculation converter.

5. A detector, comprising:
    a first resolver including a first stator, first sine and cosine windings on the stator, the first sine and cosine windings being displaced from one another by ninety electrical degrees, a first excitation winding on the stator, and a first rotor providing poles for varying the reluctance between windings according to a rotor position $\theta_1$;
    a second resolver including a second stator, second sine and cosine windings on the stator, the second sine and cosine windings being displaced from one another by ninety electrical degrees, a second excitation winding on the stator, and a second rotor providing poles for varying the reluctance between windings according to a rotor position $\theta_2$, wherein the first and second sine windings are serially connected and the first and second cosine windings are serially connected; and
    a controller for calculating a deviation angle Δθ of the first and second resolvers based on an output signal from the serially connected sine windings and an output signal from the serially connected cosine windings.

6. A detector in accordance with claim 5, wherein the deviation angle Δθ is represented by the equation $\Delta\theta=(\theta_1-\theta_2)$.

7. A detector in accordance with claim 5, wherein the sine value of the first and second resolvers is represented by Es, the cosine value of the first and second resolvers is represented by Ec, and $\Delta\theta=\tan^{-1}(Es/Ec)$.

8. A detector in accordance with claim 5, wherein a range of the deviation angle Δθ is ±90°.

9. A detector in accordance with claim 5, wherein the detector includes a digital converter connected to the first and second sine and cosine windings for converting sine and cosine values of the first and second resolvers into digital values, wherein the controller is connected to the digital converter for receiving the digital values.

* * * * *